US008709587B2

(12) United States Patent
Umeno

(10) Patent No.: US 8,709,587 B2
(45) Date of Patent: Apr. 29, 2014

(54) RESIN COMPOSITION, PREPREG, RESIN SHEET, METAL-CLAD LAMINATE, PRINTED WIRING BOARD, MULTILAYER PRINTED WIRING BOARD AND SEMICONDUCTOR DEVICE

(75) Inventor: Kuniharu Umeno, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 219 days.

(21) Appl. No.: 13/141,634

(22) PCT Filed: Dec. 22, 2009

(86) PCT No.: PCT/JP2009/071334
§ 371 (c)(1),
(2), (4) Date: Jun. 22, 2011

(87) PCT Pub. No.: WO2010/074085
PCT Pub. Date: Jul. 1, 2010

(65) Prior Publication Data
US 2011/0255258 A1 Oct. 20, 2011

(30) Foreign Application Priority Data

Dec. 25, 2008 (JP) ................................ 2008-329012

(51) Int. Cl.
| B32B 15/092 | (2006.01) |
| B32B 27/04 | (2006.01) |
| B32B 27/38 | (2006.01) |
| B32B 38/08 | (2006.01) |
| C08G 59/22 | (2006.01) |
| C08G 59/32 | (2006.01) |
| C08G 59/68 | (2006.01) |
| C09J 163/00 | (2006.01) |
| C09D 163/00 | (2006.01) |
| C08L 63/00 | (2006.01) |

(52) U.S. Cl.
USPC ............... 428/301.1; 428/297.4; 428/300.7; 428/301.4; 428/413; 428/414; 428/416; 428/418; 428/901; 523/445; 523/451; 523/466; 525/528

(58) Field of Classification Search
USPC ............. 428/297.4, 413, 414, 416, 418, 901, 428/300.7, 301.1, 301.4; 523/445, 451, 523/466; 525/528
See application file for complete search history.

(56) References Cited

U.S. PATENT DOCUMENTS

| 5,766,534 A * | 6/1998 | White et al. .................. 264/258 |
| 6,306,792 B1 * | 10/2001 | Miyake et al. ................ 502/155 |
| 2005/0075474 A1 * | 4/2005 | Horimoto et al. ............... 528/88 |
| 2005/0182203 A1 * | 8/2005 | Sugano et al. ................ 525/423 |
| 2007/0213477 A1 * | 9/2007 | Ukawa et al. ................. 525/523 |
| 2009/0215943 A1 * | 8/2009 | Hirose et al. .................. 524/405 |
| 2009/0234080 A1 | 9/2009 | Goh |
| 2010/0044090 A1 * | 2/2010 | Endo ............................. 174/260 |
| 2010/0227170 A1 | 9/2010 | Endo et al. |

FOREIGN PATENT DOCUMENTS

| JP | 9-278882 A | 10/1997 | |
| JP | 2000-246113 A | 9/2000 | |
| JP | 2002-69156 A | 3/2002 | |
| JP | 2005-240019 A | 9/2005 | |
| JP | 2007-119710 A | 5/2007 | |
| JP | 2010-31263 A | 2/2010 | |
| WO | WO 2007037500 A1 * | 4/2007 | ............. C08G 59/40 |
| WO | WO 2008/126411 A1 | 10/2008 | |
| WO | WO 2008126825 A1 * | 10/2008 | ............. C08L 63/00 |

OTHER PUBLICATIONS

Machine translation of JP 09-278882, provided by the JPO website (no date).*
Machine translation of JP 2002-069156, provided by the JPO website (no date).*
International Search Report for PCT/JP2009/071334, mailed on Mar. 2, 2010.

* cited by examiner

Primary Examiner — Michael J Feely
(74) Attorney, Agent, or Firm — Birch, Stewart, Kolasch & Birch, LLP

(57) ABSTRACT

Disclosed is a resin composition exhibiting a low thermal expansion coefficient, as well as higher heat resistance, flame resistance and insulation reliability than ever before when used in a multilayer printed wiring board that requires fine wiring work. Also disclosed are a prepreg, a resin sheet, a metal-clad laminate, a printed wiring board, a multilayer printed wiring board and a semiconductor device, all of which comprising the resin composition. The resin composition of the present invention comprises (A) an epoxy resin, (B) a cyanate resin and (C) an onium salt compound as essential components.

19 Claims, 2 Drawing Sheets

Evaluation sample which is not treated with chemical solutions after the outer layer copper foil is etched.

Evaluation sample which is determined as having no problem after it is treated with chemical solutions.

Evaluation sample which is determined as having a problem
after it is treated with chemical solutions.

RESIN COMPOSITION, PREPREG, RESIN SHEET, METAL-CLAD LAMINATE, PRINTED WIRING BOARD, MULTILAYER PRINTED WIRING BOARD AND SEMICONDUCTOR DEVICE

TECHNICAL FIELD

The present invention relates to a resin composition, a prepreg, a resin sheet, a metal-clad laminate, a printed wiring board, a multilayer printed wiring board and a semiconductor device.

BACKGROUND ART

In recent years, with growing demand for highly-functional electronics, printed wiring boards capable of high-density mounting are required to miniaturize and increase density, and there is a tendency that width of conducting circuits or width between conducting circuits formed on the printed wiring boards further narrow. For example, in inner layer circuit boards used for multilayer printed wiring boards, the width of conducting circuits and width between conducting circuits (L/S) have a tendency to narrow from conventional 100 μm/100 μm to 50 μm/50 μm, and further to 20 μm/20 μm. Therefore, practical application of outer layer circuits of the multilayer printed wiring boards having the L/S of 15 μm/15 μm have been particularly studied.

When the L/S narrows, insulating layers used for the multilayer printed wiring boards is required to have excellent reliability than ever before. Specifically, the insulating layer comprising a resin composition such as an epoxy resin composition is required to have lower thermal expansion coefficient, and it is further required to have higher heat resistance, flame resistance and insulation reliability.

However, resin compositions used for the insulating layers of the conventional printed wiring boards are not capable of exhibiting a low thermal expansion coefficient and higher heat resistance, flame resistance and insulation reliability than ever before, even if fine wiring is formed on the printed wiring board (for example, Patent Literatures 1 and 2).

CITATION LIST

Patent Literature

[Patent Literature 1] Japanese Patent Application Laid-Open (JP-A) No. 2005-240019
[Patent Literature 2] JP-A No. 2007-119710

SUMMARY OF INVENTION

Technical Problem

The present invention provides a resin composition exhibiting a low thermal expansion coefficient, as well as higher heat resistance, flame resistance and insulation reliability than ever before.

The present invention also provides a resin sheet, a prepreg, a multilayer printed wiring board and a semiconductor device.

Solution to Problem

The above object can be achieved by the following [1] to [17].

[1] A resin composition comprising (A) an epoxy resin, (B) a cyanate resin and (C) an onium salt compound as essential components.

[2] The resin composition according to [1], wherein the onium salt compound (C) is a compound represented by the following formula (1):

[Chemical formula 1]

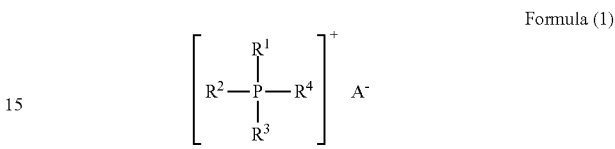

wherein P is a phosphorus atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; and $A^-$ is an anion of an n(n≥1)-valent proton donor having in a molecule at least one or more protons which can be released from the molecule, or a complex anion thereof.

[3] The resin composition according to [1] or [2], wherein the onium salt compound (C) is a compound represented by the following formula (2):

[Chemical formula 2]

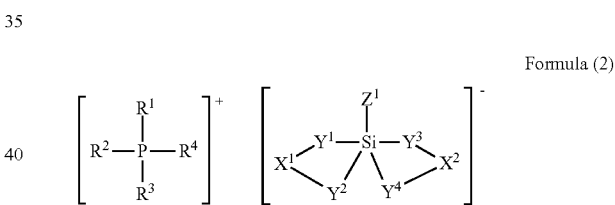

wherein P is a phosphorus atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; $X^1$ is an organic group bonding to substituents $Y^1$ and $Y^2$; $X^2$ is an organic group bonding to substituents $Y^3$ and $Y^4$; each of $Y^1$ and $Y^2$ is a group resulting from a proton-donating substituent through release of a proton, and $Y^1$ and $Y^2$ in the same molecule bond to a silicon atom to form a chelate structure; each of $Y^3$ and $Y^4$ is a group resulting from a proton-donating substituent through release of a proton, and $Y^3$ and $Y^4$ in the same molecule bond to a silicon atom to form a chelate structure; $X^1$ and $X^2$ can be identical or different from each other; $Y^1$, $Y^2$, $Y^3$ and $Y^4$ can be identical or different from each other; and $Z^1$ is an organic group having a substituted or unsubstituted, aromatic or heterocyclic ring or is a substituted or unsubstituted aliphatic group.

[4] The resin composition according to [1] or [2], wherein the onium salt compound (C) is a compound represented by the following formula (3):

[Chemical formula 3]

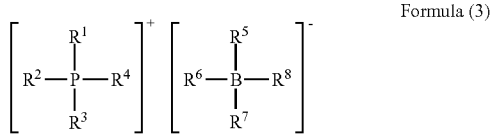

Formula (3)

wherein P is a phosphorus atom; B is a boron atom; each of R¹, R², R³ and R⁴ is an organic group having a substituted or unsubstituted, aromatic or heterocyclic ring or is a substituted or unsubstituted aliphatic group, and R¹ to R⁴ can be identical or different from each other; and each of R⁵, R⁶, R⁷ and R⁸ is an organic group having a substituted or unsubstituted, aromatic or heterocyclic ring, a substituted or unsubstituted aliphatic group, or an n(n1)-valent proton donor having in a molecule at least one or more protons which can be released from the molecule, and R⁵ to R⁸ can be identical or different from each other.

[5] The resin composition according to [1] or [2], wherein the onium salt compound (C) is a compound represented by the following formula (4):

[Chemical formula 4]

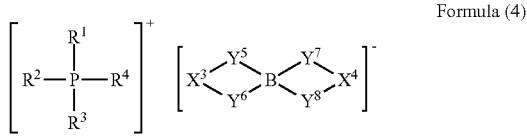

Formula (4)

wherein P is a phosphorus atom; B is a boron atom; each of R¹, R², R³ and R⁴ is an organic group having a substituted or unsubstituted, aromatic or heterocyclic ring or is a substituted or unsubstituted aliphatic group, and R¹ to R⁴ can be identical or different from each other; X³ is an organic group bonding to substituents Y⁵ and Y⁶; X⁴ is an organic group bonding to substituents Y⁷ and Y⁸; each of Y⁵ and Y⁶ is a group resulting from a proton-donating substituent through release of a proton, and Y⁵ and Y⁶ in the same molecule bond to a boron atom to form a chelate structure; each of Y⁷ and Y⁸ is a group resulting from a proton-donating substituent through release of a proton, and Y⁷ and Y⁸ in the same molecule bond to a boron atom to form a chelate structure; X³ and X⁴ can be identical or different from each other; and Y⁵, Y⁶, Y⁷ and Y⁸ can be identical or different from each other.

[6] The resin composition according to any of [1] to [5], wherein the resin composition further comprises an inorganic filler.

[7] A prepreg comprising a base material impregnated with the resin composition defined by any of [1] to [6].

[8] A resin sheet comprising an insulating layer and a film or metal foil, wherein the insulating layer is on the film or metal foil, and comprises the resin composition defined by any of [1] to [6].

[9] A metal-clad laminate comprising a resin-impregnated base material layer and a metal foil, wherein the metal foil is on at least one surface of the resin-impregnated base material layer, and the resin-impregnated base material layer comprises a base material impregnated with the resin composition defined by any of [1] to [6].

[10] The metal-clad laminate according to [9], obtained by laying a metal foil on at least one surface of a prepreg or on at least one surface of a stack of two or more prepregs, the prepreg or each of the prepregs being the prepreg defined by [7], and applying heat and pressure.

[11] A printed wiring board comprising the metal-clad laminate defined by [9] or [10] as an inner layer circuit board.

[12] A multilayer printed wiring board obtained by laying the prepreg defined by [7] on one or both surfaces of an inner layer circuit board, and applying heat and pressure.

[13] The multilayer printed wiring board according to [12], comprising the metal-clad laminate defined by [9] or [10] as the inner layer circuit board.

[14] A multilayer printed wiring board comprising an insulating layer and an inner layer circuit, wherein the insulating layer is on the inner layer circuit, and comprises the epoxy resin composition defined by any of [1] to [6].

[15] The multilayer printed wiring board according to [14], obtained by laying the resin sheet defined by [8] on one or both surfaces of an inner layer circuit board, and applying heat and pressure.

[16] The multilayer printed wiring board according to [15], comprising the metal-clad laminate defined by [9] or [10] as the inner layer circuit board.

[17] A semiconductor device comprising the printed wiring board defined by any of [11] to [16], and a semiconductor element mounted on the printed wiring board.

Advantageous Effects of Invention

The resin composition of the present invention exhibits a low thermal expansion coefficient, as well as higher heat resistance, flame resistance and insulation reliability than ever before when used in a multilayer printed wiring board that requires fine wiring work.

DESCRIPTION OF EMBODIMENTS

Figure 1:
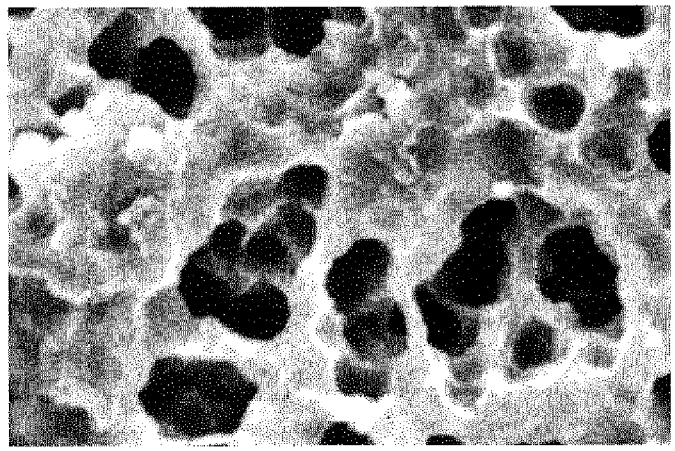
FIG. 1 shows a SEM photograph of an evaluation sample used for a chemical resistance test.

Hereinafter, a resin composition, prepreg, resin sheet, metal-clad laminate, printed wiring board, multilayer printed wiring board and semiconductor device of the present invention will be described.

[Resin Composition]

First, the resin composition of the present invention will be described.

The resin composition of the present invention comprises (A) an epoxy resin, (B) a cyanate resin and (C) an onium salt compound as essential components.

The epoxy resin (A) is not particularly limited as long as it has two or more epoxy groups in a molecule thereof. The examples include: bisphenol type epoxy resins such as bisphenol A type epoxy resins, bisphenol F type epoxy resins and brominated bisphenol type epoxy resins; epoxy compounds produced by reacting epichlorohydrin with hydroxyl groups of phenols or naphthols, such as biphenyl type epoxy resins, biphenyl aralkyl type epoxy resins, stilbene type epoxy resins, phenol novolac type epoxy resins, cresol novolac type epoxy resins, naphthalene type epoxy resins, dicyclopentadiene type epoxy resins and dihydroxybenzene type epoxy resins; epoxy resins produced by oxidizing olefin with peracid to epoxidate; and glycidyl ester type epoxy resins. They can be used alone or in combination of two or more kinds. Among them, biphenyl aralkyl type epoxy resins are preferable from the viewpoint of flame resistance.

The cyanate resin (B) can be obtained by, for example, reacting a cyanogen halide compound with a phenol and, as needed, prepolymerizing the reactant by a method such as heating. Specific examples of the cyanate resin include: novolac type cyanate resins; bisphenol type cyanate resins such as bisphenol A type cyanate resins, bisphenol E type cyanate resins and tetramethylbisphenol F type cyanate resins; and dicyclopentadiene type cyanate resins. They can be used alone or in combination of two or more kinds.

The above resins can be prepolymerized and used as the cyanate resin (B). That is, the cyanate resins can be used alone or in combination with a cyanate resin having a different weight average molecular weight, or each of the cyanate resins can be used in combination with a prepolymer thereof.

This prepolymer is generally obtained by, for example, trimerizing the cyanate resin by heating reaction or the like, and it is favorably used to control the formability and flowability of the resin composition.

This prepolymer is not particularly limited. For example, one having a trimerization rate of 20 to 50% by weight can be used.

The compounding ratio of the epoxy resin (A) and the cyanate resin (B) is not particularly limited. However, when the amount of the epoxy resin is 1, the amount of the cyanate resin (B) is preferably in the range of 0.25 to 9.00, more preferably in the range of 0.40 to 6.00. Thereby, the resin composition of the present invention exhibits excellent insulation reliability, low thermal expansion characteristics and excellent flame resistance.

The onium salt compound (C) is preferably a compound represented by the following formula (1):

[Chemical formula 5]

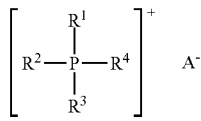

Formula (1)

wherein P is a phosphorus atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; and $A^-$ is an anion of an $n(n \geq 1)$-valent proton donor having in a molecule at least one or more protons which can be released from the molecule, or a complex anion thereof.

The compound represented by the formula (1) can be synthesized by the method disclosed in Japanese Patent Application Laid-Open (JP-A) No. 2004-231765, for instance. For example, the compound can be obtained by the steps of: mixing 4,4'-bisphenol S, tetraphenylphosphonium bromide and ion-exchange water; dropping an aqueous solution of sodium hydroxide to the mixture while heating and agitating the mixture; and purifying a precipitated crystal by filtration, washing with water, and vacuum drying.

The onium salt compound (C) is preferably a compound represented by the following formula (2).

[Chemical formula 6]

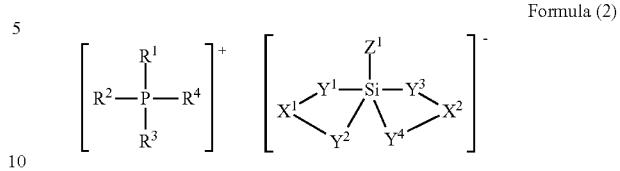

Formula (2)

wherein P is a phosphorus atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; $X^1$ is an organic group bonding to substituents $Y^1$ and $Y^2$; $X^2$ is an organic group bonding to substituents $Y^3$ and $Y^4$; each of $Y^1$ and $Y^2$ is a group resulting from a proton-donating substituent through release of a proton, and $Y^1$ and $Y^2$ in the same molecule bond to a silicon atom to form a chelate structure; each of $Y^3$ and $Y^4$ is a group resulting from a proton-donating substituent through release of a proton, and $Y^3$ and $Y^4$ in the same molecule bond to a silicon atom to form a chelate structure; $X^1$ and $X^2$ can be identical or different from each other; $Y^1$, $Y^2$, $Y^3$ and $Y^4$ can be identical or different from each other; and $Z^1$ is an organic group having a substituted or unsubstituted, aromatic or heterocyclic ring or is a substituted or unsubstituted aliphatic group.

The compound represented by the formula (2) can be synthesized by the method disclosed in JP-A No. 2007-246671, for instance. For example, the compound can be obtained by the steps of: uniformly dissolving 2,3-dihydroxynaphthalene, 3-mercaptopropyltrimethoxysilane and methanol while agitating; dropping an acetonitrile solution of triethylamine to the mixture in a flask while agitating; gradually dropping a methanol solution of tetraphenylphosphonium bromide into the flask; and purifying a precipitated crystal by filtration, washing with water, and vacuum drying.

The onium salt compound (C) is preferably a compound represented by the following formula (3):

[Chemical formula 7]

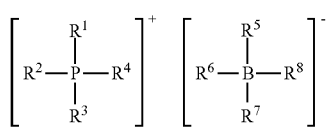

Formula (3)

wherein P is a phosphorus atom; B is a boron atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; and each of $R^5$, $R^6$, $R^7$ and $R^8$ is an organic group having a substituted or unsubstituted, aromatic or heterocyclic ring, a substituted or unsubstituted aliphatic group, or an $n(n \geq 1)$-valent proton donor having in a molecule at least one or more protons which can be released from the molecule, and $R^5$ to $R^8$ can be identical or different from each other.

The onium salt compound (C) is preferably a compound represented by the following formula (4):

[Chemical formula 8]

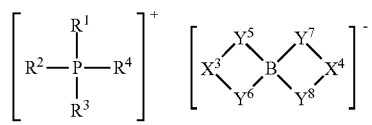

Formula (4)

wherein P is a phosphorus atom; B is a boron atom; each of $R^1$, $R^2$, $R^3$ and $R^4$ is an organic group having a substituted or unsubstituted, aromatic or heterocyclic ring or is a substituted or unsubstituted aliphatic group, and $R^1$ to $R^4$ can be identical or different from each other; $X^3$ is an organic group bonding to substituents $Y^5$ and $Y^6$; $X^4$ is an organic group bonding to substituents $Y^7$ and $Y^8$; each of $Y^5$ and $Y^6$ is a group resulting from a proton-donating substituent through release of a proton, and $Y^5$ and $Y^6$ in the same molecule bond to a boron atom to form a chelate structure; each of $Y^7$ and $Y^8$ is a group resulting from a proton-donating substituent through release of a proton, and $Y^7$ and $Y^8$ in the same molecule bond to a boron atom to form a chelate structure; $X^3$ and $X^4$ can be identical or different from each other; and $Y^5$, $Y^6$, $Y^7$ and $Y^3$ can be identical or different from each other.

The compounds represented by the formulae (3) and (4) can be synthesized by the method disclosed in JP-A No. 2000-246113, for instance. For example, the compounds can be obtained by the steps of: uniformly dissolving boric acid, 3-hydroxy-2-naphthoic acid, methyl cellosolve and pure water while agitating; dropping a solution obtained by uniformly dissolving tetraphenylphosphonium bromide in a mixed solvent of methanol/pure water to the mixture in a flask while agitating; and purifying a precipitated crystal by filtration, washing with water, and vacuum drying.

Examples of $R^1$, $R^2$, $R^3$ and $R^4$ in the formulae (1) to (4) include organic groups having a substituted or unsubstituted aromatic ring having a monocyclic structure or a condensed-ring structure comprising 2 to 3 rings, organic groups having a substituted or unsubstituted heterocyclic ring having a monocyclic structure or a condensed-ring structure comprising 2 to 3 rings, and substituted or unsubstituted aliphatic hydrocarbon groups having 1 to 10 carbon atoms.

Examples of $R^1$, $R^2$, $R^3$ and $R^4$ in the formulae (1) to (4) include organic groups having a substituted or unsubstituted aromatic ring, such as a phenyl group, a methylphenyl group, a methoxyphenyl group, a hydroxyphenyl group, a naphthyl group, a hydroxynaphthyl group and a benzyl group; organic groups having a substituted or unsubstituted heterocyclic ring, such as a furyl group, a thienyl group, a pyrrolyl group, a pyridyl group, a pyrimidyl group, a piperidyl group, an indolyl group, a morpholinyl group, a quinolyl group, an isoquinolyl group, an imidazolyl group and an oxazolyl group; and substituted or unsubstituted aliphatic groups such as a methyl group, an ethyl group, an n-butyl group, an n-octyl group and a cyclohexyl group. From the viewpoint of reaction activity and stability, substituted or unsubstituted aromatic groups are preferable, such as a phenyl group, a methylphenyl group, a methoxyphenyl group, a hydroxyphenyl group and a hydroxynaphthyl group. Examples of a substituent of the organic group having an aromatic ring, that of the organic group having a heterocyclic ring, and that of the aliphatic group include a methyl group, an ethyl group, a hydroxyl group, etc.

Examples of $R^5$, $R^6$, $R^7$ and $R^8$ in the formula (3) include monovalent organic groups having an aromatic ring having a monocyclic structure or a condensed-ring structure comprising 2 to 3 rings, monovalent organic groups having a heterocyclic ring having a monocyclic structure or a condensed-ring structure comprising 2 to 3 rings, and substituted or unsubstituted monovalent aliphatic groups having 1 to 8 carbon atoms.

In the formula (3), each of $R^5$, $R^6$, $R^7$ and $R^8$ is a monovalent organic group having an aromatic or heterocyclic ring or a monovalent aliphatic group. Among $R^5$ to $R^8$, at least one is a group resulting from a proton donor through release of one proton, the donor being selected from the group consisting of an aromatic polycarboxylic acid having two or more carboxyl groups in a molecule thereof, an aromatic carboxylic acid having at least one acid anhydride group and at least one carboxyl group in a molecule thereof, a polyphenol compound having two or more hydroxyl groups in a molecule thereof, and an aromatic compound having at least one carboxyl group and at least one phenolic hydroxyl group in a molecule thereof. $R^5$ to $R^8$ can be identical or different from each other. Examples of such a proton donor which provides a borate group include, but not limited to: aromatic polycarboxylic acids such as terephthalic acid, naphthalenedicarboxylic acid, 4,4-biphenyldicarboxylic acid, 4,4'-dicarboxydiphenylmethane, trimellitic acid and pyromellitic acid; acid anhydride group-containing aromatic carboxylic acids such as trimellitic anhydride; polyphenol compounds such as hydroquinone, catechol, resorcin, dihydroxynaphthalene, 4,4-biphenol, 4,4'-dihydroxydiphenylmethane, 2,2-bis(4-hydroxyphenyl)propane, 4,4'-dihydroxydiphenyl-2,2-hexafluoropropane, bis(3,5-dimethyl-4-dihydroxyphenyl)methane, bis(3,5-dimethyl-4-dihydroxyphenyl)sulfone, 4,4-dihydroxystilbene, 4,4-dihydroxy-α-methylstilbene and bisphenolfluorene; and compounds such as salicylic acid, hydroxybenzoic acid and hydroxynaphthoic acid.

In the formulae (2) and (4), each of $X^1$, $X^2$, $X^3$ and $X^4$ is an organic group having a substituted or unsubstituted aromatic ring having a monocyclic structure or a condensed-ring structure comprising 2 to 3 rings, or an organic group having a substituted or unsubstituted heterocyclic ring having a monocyclic structure or a condensed-ring structure comprising 2 to 3 rings.

$Y^1$ to $Y^8$ are substituents bonding to the aromatic or heterocyclic ring contained in $X^1$ to $X^4$. Each of $Y^1$ to $Y^8$ is a group resulting from a monovalent proton-donating substituent through release of a proton, and bonds to a boron atom or silicon atom to form a chelate ring. Among monovalent proton-donating substituents, a carboxyl group or hydroxyl group is preferable.

In such organic groups $Y^1$—$X^1$—$Y^2$, $Y^3$—$X^2$—$Y^4$, $Y^5$—$X^3$—$Y^6$ and $Y^7$—$X^4$—$Y^8$, as long as the substituents $Y^1$ to $Y^8$ are each in the position which can bond to a boron atom or silicon atom to form a chelate ring, no particular limitation is imposed on other substituents and it is also possible to use a trivalent or more proton donor. Among such organic groups, particularly preferred are aromatic or heterocyclic multifunctional carboxylic acids or polyphenols. Polyphenols in this case is a general term for compounds in which hydrogen atoms bonding to a benzene ring, naphthalene ring or other aromatic ring are substituted by two or more hydroxyl groups.

The proton-donating substituents $Y^1$ to $Y^8$ are preferably substituted at adjacent positions in the aromatic or heterocyclic ring.

In the formula (2), examples of $Z^1$ include organic groups having a substituted or unsubstituted aromatic ring having a monocyclic structure or a condensed-ring structure comprising 2 to 3 rings, organic groups having a substituted or unsubstituted heterocyclic ring having a monocyclic structure or a condensed-ring structure comprising 2 to 3 rings, and substituted or unsubstituted monovalent aliphatic groups having 1 to 8 carbon atoms. The specific examples include: substituted or unsubstituted aliphatic groups such as a methyl group, an ethyl group, a propyl group, a butyl group, a hexyl group, an octyl group, a glycidyloxypropyl group, a mercaptopropyl group, an aminopropyl group and a vinyl group; organic groups having a substituted or unsubstituted aromatic ring, such as a phenyl group, a benzyl group, a naphthyl group and a biphenyl group; and organic groups having a substituted or unsubstituted heterocyclic ring, such as a pyridine group and a pyrrol group. Among them, a methyl group, a phenyl group, a naphthyl group and a glycidyloxypropyl group are preferable from the viewpoint of thermal stability. As the substituent of the aliphatic group, there may be mentioned a glycidyl group, a mercapto group and an amino group. As the substituent of the aromatic or heterocyclic ring, there may be mentioned a methyl group, an ethyl group, a hydroxyl group and an amino group.

The content of the onium salt compound (C) is not particularly limited, and is preferably 0.01 to 10% by weight, more preferably 0.1 to 5% by weight, with respect to the total amount of the epoxy resin (A) and the cyanate resin (B). Thereby, the resin composition of the present invention can exhibit excellent curability, flowability and cured-product properties.

As needed, the resin composition of the present invention can contain an inorganic filler. Examples of the inorganic filler include: silicate salts such as talc, calcined clay, uncalcined clay, mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates and sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate.

As the inorganic filler, they can be used alone or in combination of two or more kinds. Among the above, preferred is silica, more preferred is fused silica, and even more preferred is spherical fused silica. Silica is preferable from the viewpoint of excellent low thermal expansion characteristics.

The shape of the inorganic filler is not particularly limited, and the examples include a fractured shape and a spherical shape. For example, in prepreg production, to allow the resin composition to penetrate a base material, it is necessary to decrease the melting viscosity of the resin composition to ensure penetration; therefore, spherical silica is preferably used. The preferred shape of the inorganic filler can be determined appropriately according to the intended use/purpose of the resin composition.

The particle diameter of the inorganic filler is not particularly limited. The inorganic filler preferably has an average particle diameter of 0.01 to 5.0 µm, more preferably 0.1 to 2.0 µm. If the average particle diameter of the inorganic filler is less than the lower limit, upon the preparation of a resin varnish using the resin composition of the present invention, the viscosity of the resin varnish increases, so that the workability of the resin composition may be affected in prepreg production. To the contrary, if the average particle diameter of the inorganic filler exceeds the upper limit, a phenomenon such as sedimentation of the inorganic filler in the resin varnish may be caused. By setting the average particle diameter of the inorganic filler within the above range, excellent workability is provided.

As the inorganic filler, there may be used, but not limited to, an inorganic filler having a monodisperse average particle diameter or an inorganic filler having a polydisperse average particle diameter. It is also possible to use one or more kinds of inorganic fillers having a monodisperse average particle diameter and/or one or more kinds of organic fillers having a polydisperse average particle diameter.

The content of the inorganic filler is not particularly limited, and is preferably 10 to 900 parts by weight when the total weight of the epoxy resin (A) and the cyanate resin (B) is 100 parts by weight. It is more preferably 25 to 400 parts by weight, so that the resin composition exhibits excellent workability and formability in resin sheet and prepreg production.

To increase various kinds of properties such as compatibility, stability and workability of the resin, the resin composition of the present invention can appropriately contain various kinds of additives other than the above inorganic fillers, such thermoplastic resin typified by a phenoxy resin or olefinic resin, an organosilane coupling agent, a leveling agent, a defoaming agent, an antioxidant, a pigment, a dye, a flame retardant, an ultraviolet absorbing agent, an ion scavenger, a reactive or unreactive diluent, a thixotropy promoter and a thickener.

[Prepreg]

Next, the prepreg of the present invention will be described.

The prepreg comprising the resin composition of the present invention is obtained by impregnating a base material with the resin composition and heat-drying the same. A prepreg is obtained thereby, which is suitable for producing a printed wiring board having excellent various kinds of properties such as dielectric properties and mechanical, electrical connection reliability at high temperature and high humidity.

The method for producing the prepreg is as follows. First, the resin composition of the present invention is dissolved in an organic solvent and then mixed and agitated with a mixer to produce a resin varnish. Examples of the organic solvent include acetone, methyl ethyl ketone, methyl isobutyl ketone, toluene, ethyl acetate, cyclohexane, heptane, cyclohexanone, cyclopentanone, tetrahydrofuran, dimethylformamide, dimethylacetamide, dimethylsulfoxide, ethylene glycol, cellosolves, carbitols and anisole. Examples of the mixer include the various kinds of mixers such as an ultrasonic dispersion mixer, a high-pressure impact dispersion type mixer, a high-speed rotary dispersion type mixer, a bead mill mixer, a high-speed shearing dispersion type mixer and a rotation/revolution type dispersion mixer.

The content of the resin composition in the resin varnish is not particularly limited, and is preferably 45 to 85% by weight, more preferably 55 to 75% by weight.

Next, a base material is impregnated with the resin varnish by a method and dried to produce a prepreg. Examples of the method include impregnating the base material with the resin varnish, applying the resin varnish onto the base material with a coater selected from various kinds of coaters, spraying the resin varnish on the base material, etc. Among them, preferred is impregnating the base material with the resin varnish. Thereby, it is possible to increase the impregnation of the resin composition into the base material. In the case that the base material is impregnated with the resin varnish, a general impregnating and coating apparatus can be used.

The base material is not particularly limited, and the examples include: glass fiber base materials such as a glass woven fabric and a glass nonwoven fabric; synthetic fiber base materials that are made of woven or nonwoven fabrics comprising a main material selected from the group consisting of polyamide-based resin fibers such as a polyamide resin fiber, an aromatic polyamide resin fiber and a wholly aromatic polyamide resin fiber, polyester-based resin fibers such as a polyester resin fiber, an aromatic polyester resin fiber and a wholly aromatic polyester resin fiber, polyimide resin fibers and fluorine resin fibers; and organic fiber base materials including paper base materials comprising a main material selected from the group consisting of a craft paper, a cotton linter paper and a mixed paper of linter and craft pulp. Among them, glass fiber base materials are preferred. Thereby, there is an improvement in strength of the prepreg, and the prepreg can have low water absorption properties and a small thermal expansion coefficient.

The glass comprising the glass fiber base materials are not particularly limited, and the examples include E glass, C glass, A glass, S glass, D glass, NE glass, T glass and H glass. Among them, E glass, T glass and S glass are preferred. Thereby, the glass fiber base materials can have high elasticity and a small thermal expansion coefficient.

[Resin Sheet]

Next, the resin sheet of the present invention will be described.

The resin sheet comprising the resin composition of the present invention is obtained by forming an insulating layer comprising the resin composition of the present invention on a film or metal foil.

The method for producing the resin sheet is as follows. First, the resin composition of the present invention for forming the insulating layer is dissolved in an organic solvent and then mixed and agitated with a mixer to produce a resin varnish. Examples of the organic solvent include acetone, methyl ethyl ketone, methyl isobutyl ketone, toluene, ethyl acetate, cyclohexane, heptane, cyclohexanone, cyclopentanone, tetrahydrofuran, dimethylformamide, dimethylacetamide, dimethylsulfoxide, ethylene glycol, cellosolves, carbitols and anisole. Examples of the mixer include various kinds of mixers such as an ultrasonic dispersion mixer, a high-pressure impact dispersion type mixer, a high-speed rotary dispersion type mixer, a bead mill mixer, a high-speed shearing dispersion type mixer and a rotation-revolution type dispersion mixer.

The content of the resin composition in the resin varnish is not particularly limited, and is preferably 45 to 85% by weight, more preferably 55 to 75% by weight.

Next, the resin varnish is applied onto a film or metal foil with a coater selected from various kinds of coaters and dried. Alternatively, the resin varnish is applied onto a film or metal foil with a spraying apparatus and dried. A resin sheet can be produced by any of the methods.

The caster is not particularly limited. The examples include a roll coater, a bar coater, a knife coater, a gravure coater, a die coater, a comma coater and a curtain coater. Among them, a die coater, a knife coater and a comma coater are preferably used. Thereby, a resin sheet which causes no void and has an insulating layer having a uniform thickness can be efficiently produced.

Since the insulating layer is formed on the film, the film is preferably selected from films that can be handled easily. Moreover, in the production of a multilayer printed wiring board, the film is removed after the insulating layer of the resin sheet is laid on a surface of an inner layer circuit board, so that the film is preferably one that can be removed easily after the insulating layer is laid on the inner layer circuit board. Therefore, as the film, heat-resistant thermoplastic resin films comprising polyester resins such as polyethylene terephthalate and polybutylene terephthalate, fluorine resins and polyimide resins are preferably used. Among these carrier films, a film made of polyester is particularly preferable. Thereby, the film can be easily removed from the insulating layer with appropriate strength.

The thickness of the film is not particularly limited, and is preferably 1 to 100 μm, more preferably 3 to 50 μm. If the thickness of the film is within the range, handling is easy and the surface of the insulating layer has excellent flatness.

As with the resin sheet with the film, the resin sheet with the metal foil can be used in the method for removing the metal foil after the resin sheet is laid on the inner layer circuit board, or can be used as a conducting circuit after the resin sheet with the metal foil is laid on the inner layer circuit board and then the metal foil is etched. The metal foil is not particularly limited, and the examples include metal foils made of copper and/or a copper alloy, aluminum and/or an aluminum alloy, iron and/or an iron alloy, silver and/or a silver alloy, gold and/or a gold alloy, zinc and/or a zinc alloy, nickel and/or a nickel alloy, and tin and/or a tin alloy.

The thickness of the metal foil is not particularly limited, and is preferably 0.1 μm or more and 70 μm or less, more preferably 1 μm or more and 35 μm or less, still more preferably 1.5 μm or more and 18 μm or less. If the thickness of the metal foil is less than the lower limit, when the metal foil is etched and used as a conducting circuit, due to a pinhole or scratch of the metal foil, there may be caused non-uniform plating, circuit disconnection, permeation of chemical solution (such as etching solution and desmear solution) and so on when forming a circuit pattern. If the thickness of the metal foil exceeds the upper limit, the thickness of the metal foil may greatly vary or the surface roughness of the roughened surface of the metal foil may greatly vary.

As the metal foil, an ultrathin metal foil with a carrier foil can also be used. The ultrathin metal foil with the carrier foil is a metal foil in which a removable carrier foil is attached to an ultrathin metal foil. By using the ultrathin metal foil with the carrier foil, an ultrathin metal foil layer can be formed on both surfaces of the insulating layer. Therefore, when circuits are formed by the semi-additive method or the like, by performing electrolytic plating directly on the ultrathin metal foil as a power feeding layer without performing electroless plating, flash etching can be performed on the ultrathin copper foil after circuits are formed. By using the ultrathin metal foil with the carrier foil, even though it is an ultrathin metal foil having a thickness of 10 μm or less, it is possible to prevent the ultrathin metal foil from a decrease in handling properties or the ultrathin copper foil from cracking or breaking in a press process, for example. The ultrathin metal foil preferably has a thickness of 0.1 μm or more and 10 μm or less, more preferably 0.5 μm or more and 5 μm or less, still more preferably 1 μm or more and 3 μm or less.

If the thickness of the ultrathin metal foil is less than the lower limit, due to a pinhole or scratch of the metal foil after removing the carrier foil, there may be caused non-uniform plating, circuit disconnection, permeation of chemical solution (such as etching solution and desmear solution) and so on when forming a circuit pattern. If the thickness of the metal foil exceeds the upper limit, the thickness of the ultrathin metal foil may greatly vary or the surface roughness of the roughened surface of the ultrathin metal foil may greatly vary.

In general, the carrier foil is removed from the ultrathin metal foil before forming a circuit pattern on a press molded laminate.

[Metal-Clad Laminate]

Next, the metal-clad laminate will be described.

The metal-clad laminate of the present invention comprises a resin-impregnated base material layer and a metal foil, wherein the metal foil is on at least one surface of the resin-impregnated base material layer, and the resin-impregnated base material layer comprises a base material impregnated with the resin composition.

The metal-clad laminate can be produced by, for example, laying a metal foil on at least one surface of the prepreg or on at least one surface of a stack of two or more prepregs, the prepreg or each of the prepregs being the above-described prepreg.

In the case of using one prepreg, metal foils are provided on both surfaces thereof, or a metal foil is provided on one surface thereof. Also, it is possible to stack two or more prepregs. In this case, metal foils or films are provided on both the outermost surfaces of the stack, or a metal foil or film is provided on one outermost surface of the stack. Then, the stack of the prepreg(s) and the metal foil is heat-pressed, thereby obtaining a metal-clad laminate.

The heating temperature is not particularly limited, and is preferably 150 to 270° C., more preferably 180 to 230° C. The pressure is not particularly limited and is preferably 1 to 5 MPa, more preferably 2 to 4 MPa. Thereby, the resin composition of the present invention can be efficiently cured.

As a different method for producing the metal-clad laminate of the present invention, it is possible to employ a method for using a long base material and a long metal foil as disclosed in paragraphs [0005] and and FIG. 1 of JP-A No. H08-150683. In this case, first, a long base material and two long metal foils are prepared, each of them being rolled into a roll. Next, two metal foils are each unreeled from the roll, and the resin composition of the present invention is applied thereto to form insulating resin layers. When the resin composition is diluted with a solvent, the resin composition is applied onto the metal foils and dried. Following the application, the insulating resin layer sides of the two metal foils are faced each other, and the base material (or two or more of the base materials) is unreeled from the roll to go between the two metal foils facing each other and they are laminated with a press roller. Next, the insulating resin layers are continuously heat-pressed to be in a semi-cured state. After cooling, the laminate is cut into a desired length. According to this method, lamination is continuously carried out while the long base material and metal foils are conveyed, so that a long, semi-cured laminate can be obtained during the production. The semi-cured laminate is cut and heat-pressed with a press machine, thereby obtaining a metal-clad laminate.

[Printed Wiring Board and Multilayer Printed Wiring Board]

Next, the printed wiring board of the present invention will be described.

The printed wiring board of the present invention comprises the metal-clad laminate as an inner layer circuit board.

The printed wiring board of the present invention comprises an insulating layer and an inner layer circuit, wherein the insulating layer is the prepreg and is on the inner layer circuit.

The printed wiring board of the present invention comprises an insulating layer and an inner layer circuit, wherein the insulating layer is on the inner layer circuit, and comprises the resin composition.

In the present invention, the printed wiring board is a printed wiring board in which circuits are formed on the insulating layer using a conductor such as a metal foil. It can be any of a single-sided printed wiring board (single-layered board), a double-sided printed wiring board (double-layered board), and a multilayer printed wiring board (multilayer board). The multilayer printed wiring board is a printed wiring board in which three or more layers are laminated by a plated-through-hole method, a build-up method, etc., and can be obtained by stacking insulating layers on an inner layer circuit board and heat-pressing them.

As the inner layer circuit board, for example, an inner layer circuit board can be suitably used, which is obtained by forming predetermined conducting circuits on the metal layer of the metal-clad laminate of the present invention by etching or the like, and performing black oxide treatment on the conducting circuits.

As the insulating layer, the prepreg of the present invention or a resin film comprising the resin composition of the present invention can be used. The resin film comprising the resin composition of the present invention can be laminated using the resin sheet of the present invention. When the prepreg of the present invention or the resin film comprising the resin composition of the present invention is used as the insulating layer, the inner layer circuit board does not have to be an inner layer circuit board comprising the metal-clad laminate of the present invention.

Hereinafter, as a typical example of the printed wiring board of the present invention, a multilayer printed wiring board will be described, which uses the metal-clad laminate of the present invention as the inner layer circuit board and the prepreg of the present invention as the insulating layer.

The inner layer circuit board is produced by forming circuits on one or both surfaces of the metal-clad laminate. In some cases, both surfaces can be electrically connected by forming through holes by drill processing or laser processing and then plating the same, for example. The prepreg is laid on the inner layer circuit board and heat-pressed to form an insulating layer. A multilayer printed wiring board can be obtained by alternately forming conducting circuit layers formed by etching or the like and the insulating layers in the same manner as above.

In particular, the prepreg is laid on the inner layer circuit board. The stack is heat-pressed under vacuum by means of a vacuum press laminator or the like, and then the insulating layers are heat-cured by means of a hot air drying machine or the like. The heat-pressing condition is not particularly limited and can be a temperature of 60 to 160° C. and a pressure of 0.2 to 3 MPa, for example. The heat-curing condition is not particularly limited and can be a temperature of 140 to 240° C. and a time of 30 to 120 minutes, for example.

In the following step, the insulating layer is exposed to laser to form an opening; however, the base material has to be removed before that. The removal of the base material can be performed after the forming of the insulating layer and before the heat-curing of the insulating layer or after heat-curing the same.

Next, the insulating layer is exposed to laser to form an opening. As the laser, excimer laser, UV laser, $CO_2$ laser or the like can be used.

Resin residue (smear) or the like left after the exposure to laser is preferably removed with an oxidant such as permanganate or bichromate, that is, it is preferable to perform a desmear process. If the desmear process is insufficient and thus desmear resistance is not sufficiently ensured, there is a possibility that even if the hole is subjected to a metal plating process, electrical conduction between a upper layer metal wiring and a lower layer metal wiring is not sufficient due to the smear. The desmear process can also roughen the smooth surface of the insulating layer at the same time, so that there is an increase in the adhesion of a conducting wiring circuit which will be formed by metal plating that follows.

Next, an outer layer circuit is formed. The method for forming the outer layer circuit comprising the steps of connecting the insulating resin layers by metal plating and etching the same to form an outer layer circuit pattern.

In addition, an insulating layer is laid further thereon, and the surface of the insulating layer is roughened with an oxidant such as permanganate or bichromate. Thereafter, a new conducting wiring circuit can be formed by metal plating.

In the multilayer printed wiring board, after the circuit formation, a solder resist is formed on the outermost layer. The method for forming the solder resist is not particularly limited and can be, for example, a method comprising the steps of laminating a dry film solder resist, exposing the same to light and developing the same, or a method comprising the steps of exposing the outermost layer on which a liquid resist is printed to light, and developing the same. When the thus-obtained multilayer printed wiring board is used for a semiconductor device, an electrode part for connection is provided thereto, to which a semiconductor element is mounted. The electrode part for connection can be appropriately covered with a metal coating such as metal plating, nickel plating or solder plating. Thereafter, the multilayer printed wiring board is cut into a desired size.

[Semiconductor Device]

Next, the semiconductor device will be described.

The semiconductor device can be produced by mounting a semiconductor element on the multilayer printed wiring board produced by the above-mentioned method. Methods for semiconductor element mounting and encapsulating are not particularly limited. For example, the semiconductor device can be obtained as follows: a semiconductor element and a multilayer printed wiring board are prepared, and the position of an electrode part for connection on the multilayer printed wiring board and that of a solder bump of the semiconductor element are aligned by means of a flip chip bonder, etc.; the solder bump is heated to a temperature that is higher than the melting point by means of an IR reflow device, a heated plate or any other heating device, so that the solder bump is melted and connected to the multilayer printed wiring board; then, a liquid encapsulating resin is filled between the multilayer printed wiring board and the semiconductor element and cured, thereby obtaining the semiconductor device.

The present invention is not limited to the above embodiments, and modification and improvement within the range that the purpose of the present invention can be achieved are included in the present invention.

EXAMPLES

Hereinafter, the present invention will be explained in detail with reference to examples and comparative examples.

1. Synthesis of Onium Salt Compound (C)

An example of the method for synthesizing onium salt compound (C) used in the present invention will be described below. However, the synthesizing method is not limited thereto.

(1) Synthesis of Compound I

Into a three-neck separable flask provided with a thermometer, an agitator and a dimroth condenser, 32.9 g (0.05 mol) of tetraphenylphosphonium tetraphenylborate (product name: TPP-K; manufactured by: Hokko Chemical Industry Co., Ltd.) and 34.4 g (0.20 mol) of 1-naphthoic acid were charged and agitated at 260° C. for 5 hours under an nitrogen atmosphere. Benzene, which is the resulting by-product, was removed from the system. After cooling the mixture, the thus-obtained crystal was washed with methanol, dried and purified by vacuum drying, thereby obtaining 47.0 g of Compound I. The yield was 91%.

[Chemical formula 9]

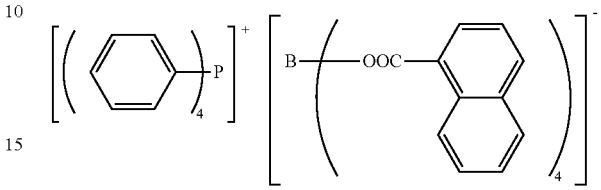

Compound I (2) Synthesis of Compound II

Into a three-neck separable flask provided with an agitator and a dimroth condenser, 75.3 g (0.40 mol) of 3-hydroxy-2-naphthoic acid, 12.4 g (0.20 mol) of boric acid, 276 g of methyl cellosolve and 248 g of pure water were charged and agitated for 30 minutes at room temperature to be uniformly dissolved. Next, a solution obtained by uniformly dissolving 84.0 g (0.20 mol) of tetraphenylphosphonium bromide in a mixed solvent of 378 g of methanol and 378 g of pure water, was added dropwise to the mixture in the flask while agitating for 1 hour; thereby, a crystal was precipitated. The precipitated crystal was collected by filtration, washed with water and purified by vacuum drying, thereby obtaining 137.2 g of Compound II. The yield was 95%.

[Chemical formula 10]

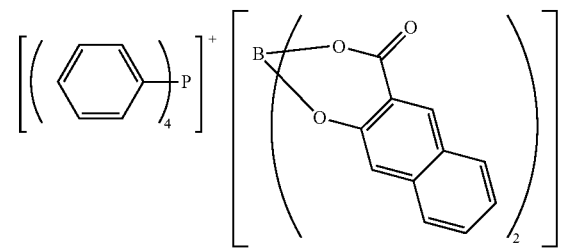

Compound II (3) Synthesis of Compound III

Into a three-neck separable flask provided with an agitator and a dimroth condenser, 8.26 g (0.040 mol) of hexyltrimethoxysilane, 12.82 g (0.080 mol) of 2,3-dihydroxynaphthalene, a sodium hydroxide solution obtained by preliminarily dissolving 1.60 g (0.040 mol) of sodium hydroxide in 10 mL of methanol, and 50 mL of methanol were charged and agitated to be uniformly dissolved. Next, a solution obtained by preliminarily dissolving 10.36 g (0.040 mol) of tetrabutylphosphonium bromide in 25 mL of methanol was gradually added dropwise to the mixture in the flask; thereby, a crystal was precipitated. The precipitated crystal was collected by filtration, washed with water and purified by vacuum drying, thereby obtaining 22.30 g of Compound III. The yield was 81%.

[Chemical formula 11]

Compound III

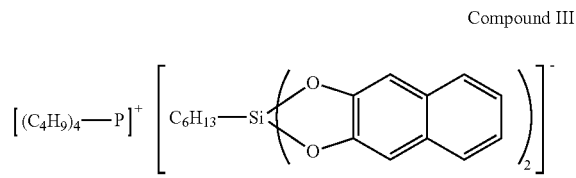

(4) Synthesis of Compound IV

Into a three-neck separable flask provided with an agitator and a dimroth condenser, 32.0 g (0.20 mol) of 2,3-dihydroxynaphthalene, 19.6 g (0.10 mol) of 3-mercaptopropyltrimethoxysilane and 150 mL of methanol were charged and uniformly dissolved while agitating. A solution obtained by preliminarily dissolving 10.12 g (0.10 mol) of triethylamine in 20 mL of acetonitrile was added dropwise to the mixture in the flask while agitating, and then a solution obtained by preliminarily dissolving 41.9 g (0.10 mol) of tetraphenylphosphonium bromide in 100 mL of methanol was gradually added dropwise to the mixture in the flask; thereby, a crystal was precipitated. The precipitated crystal was collected by filtration, washed with water and purified by vacuum drying, thereby obtaining 68.2 g of Compound IV. The yield was 90%.

[Chemical formula 12]

Compound IV

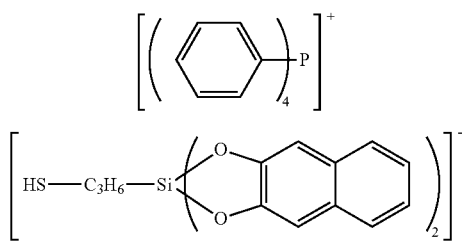

(5) Synthesis of Compound V

Into a three-neck separable flask provided with an agitator and a dimroth condenser, 32.0 g (0.20 mol) of 2,3-dihydroxynaphthalene, 19.8 g (0.10 mol) of phenyltrimethoxysilane and 150 mL of methanol were charged and uniformly dissolved while agitating. A solution obtained by preliminarily dissolving 18.5 g (0.10 mol) of tri-n-butylamine in 20 mL of acetonitrile was added dropwise to the mixture in the flask while agitating, and then a solution obtained by preliminarily dissolving 41.9 g (0.10 mol) of tetraphenylphosphonium bromide in 100 mL of methanol was gradually added dropwise to the mixture in the flask; thereby, a crystal was precipitated. The precipitated crystal was collected by filtration, washed with water and purified vacuum drying, thereby obtaining 70.0 g of Compound V. The yield was 92%.

[Chemical formula 13]

Compound V

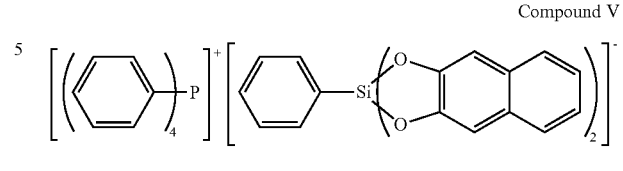

2. Production of Varnish

Example 1

The following were dissolved in methyl ethyl ketone and dispersed: 25 parts by weight of a novolac type cyanate resin (product name: Primaset PT-30; manufactured by: Lonza Japan, Ltd.), 50 parts by weight of a biphenyldimethylene type epoxy resin (product name: NC-3000; manufactured by: Nippon Kayaku Co., Ltd.; epoxy equivalent: 275) and 1.9 parts by weight of Compound I obtained above. Next, 110 parts by weight of a spherical fused silica (product name: SO-25H; manufactured by: Admatechs Company Limited; average particle diameter: 0.5 μm) and 0.5 part by weight of an epoxy silane coupling agent (product name: A-187; manufactured by: Nippon Unicar Company Limited) were added thereto and agitated for 30 minutes by means of a high speed agitator, thereby producing a resin varnish having a solid content of 70% by weight.

3. Production of Prepreg

A glass woven fabric was used as a fiber base material. The fabric was impregnated with the varnish produced above and dried at 100° C. to remove the solvent of the varnish therefrom, thereby obtaining a prepreg having a thickness of 0.1 mm. Similarly, a prepreg having a thickness of 0.04 mm was obtained.

4. Production of Laminate

The above-obtained prepreg having a thickness of 0.1 mm was sandwiched by copper foils having a thickness of 12 μm (manufactured by: Mitsui Mining & Smelting Co., Ltd.) and heat-pressed at a temperature of 220° C. and a pressure of 3 MPa for 2 hours, thereby obtaining a laminate having copper foils on both surfaces thereof.

5. Production of Multilayer Copper-Clad Laminate

A copper-clad laminate having a thickness of 0.4 mm (product name: ELC-4785GS; manufactured by: Sumitomo Bakelite Co., Ltd.) with roughened copper foil surfaces was sandwiched by the above-obtained prepregs each having a thickness of 0.04 mm. Furthermore, the stack was sandwiched by copper foils each having a thickness of 12 μm (manufactured by: Mitsui Mining & Smelting Co., Ltd.) and heat-pressed at a temperature of 220° C. and a pressure of 3 MPa for 2 hours, thereby obtaining a multilayer copper-clad laminate. The outer layer copper foils of the multilayer copper-clad laminate were etched to form pads each having a diameter of 10 mm. Copper wires were soldered between the inner layer copper and the outer layer copper pads, thereby obtaining a sample for insulation reliability.

Example 2

A varnish was produced similarly as in Example 1 except that 1.3 parts by weight of Compound II obtained above was used instead of Compound I, thus obtaining prepregs each having a thickness of 0.1 mm or 0.04 mm, a laminate and a multilayer copper-clad laminate.

Example 3

A varnish was produced similarly as in Example 1 except that 1.2 parts by weight of Compound III obtained above was used instead of Compound I, thus obtaining prepregs each having a thickness of 0.1 mm or 0.04 mm, a laminate and a multilayer copper-clad laminate.

Example 4

A varnish was produced similarly as in Example 1 except that 1.4 parts by weight of Compound IV obtained above was used instead of Compound I, thus obtaining prepregs each having a thickness of 0.1 mm or 0.04 mm, a laminate and a multilayer copper-clad laminate.

Example 5

A varnish was produced similarly as in Example 1 except that 1.4 parts by weight of Compound V obtained above was used instead of Compound I, thus obtaining prepregs each having a thickness of 0.1 mm or 0.04 mm, a laminate and a multilayer copper-clad laminate.

Example 6

A varnish was produced similarly as in Example 1 except that 25 parts by weight of a dicyclopentadiene type cyanate resin (product name: Primaset DT-4000; manufactured by: Lonza Japan, Ltd.) was used instead of parts by weight of the novolac type cyanate resin (product name: Primaset PT-30; manufactured by: Lonza Japan, Ltd.), thus obtaining prepregs each having a thickness of 0.1 mm or 0.04 mm, a laminate and a multilayer copper-clad laminate.

Example 7

A varnish was produced similarly as in Example 1 except that 25 parts by weight of a bisphenol A type cyanate resin (product name: Primaset BA200; manufactured by: Lonza Japan, Ltd.) was used instead of 25 parts by weight of the novolac type cyanate resin (product name: Primaset PT-30; manufactured by: Lonza Japan, Ltd.), thus obtaining prepregs each having a thickness of 0.1 mm or 0.04 mm, a laminate and a multilayer copper-clad laminate.

Comparative Example 1

A varnish was produced similarly as in Example 1 except that 0.4 part by weight of Imidazole I (product name: CUREZOL 1B2PZ; manufactured by: Shikoku Chemicals Corporation) was used instead of Compound I, thus obtaining prepregs each having a thickness of 0.1 mm or 0.04 mm, a laminate and a multilayer copper-clad laminate.

Comparative Example 2

A varnish was produced similarly as in Example 1 except that 0.3 part by weight of Imidazole II (product name: CUREZOL 2P4MZ; manufactured by: Shikoku Chemicals Corporation) was used instead of Compound I, thus obtaining prepregs each having a thickness of 0.1 mm or 0.04 mm, a laminate and a multilayer copper-clad laminate.

Comparative Example 3

A varnish was produced similarly as in Example 1 except that 0.3 part by weight of DBU (diazabicycloundecene (reagent); manufactured by: ALDRICH) was used instead of Compound I, thus obtaining prepregs each having a thickness of 0.1 mm or 0.04 mm, a laminate and a multilayer copper-clad laminate.

Comparative Example 4

A varnish was produced similarly as in Example 1 except that 25 parts by weight of a dicyclopentadiene type cyanate resin (product name: Primaset DT-4000; manufactured by: Lonza Japan, Ltd.) and 0.5 part by weight of Imidazole I (product name: CUREZOL 1B2PZ; manufactured by: Shikoku Chemicals Corporation) were used, thus obtaining prepregs each having a thickness of 0.1 mm or 0.04 mm, a laminate and a multilayer copper-clad laminate.

Comparative Example 5

A varnish was produced similarly as in Example 1 except that 25 parts by weight of a bisphenol A type cyanate resin (product name: Primaset BA200; manufactured by: Lonza Japan, Ltd.) and 0.5 part by weight of Imidazole I (product name: CUREZOL 1B2PZ; manufactured by: Shikoku Chemicals Corporation) were used, thus obtaining prepregs each having a thickness of 0.1 mm or 0.04 mm, a laminate and a multilayer copper-clad laminate.

The evaluation method will be described, hereinafter.

(1) Linear Thermal Expansion Coefficient

By means of a thermomechanical analyzer (manufactured by: TA Instruments), two-cycle measurement of linear thermal expansion coefficient (heating rate: 10° C./min; temperatures: 25 to 300° C.; load: 5 g) was conducted in a tensile mode under a nitrogen atmosphere. The thermal expansion coefficient was the average linear thermal expansion coefficient obtained from those measured in the temperature range of 50 to 100° C. in the second cycle.

Evaluation samples were each obtained by removing the copper foils of each laminate having the copper foils by etching, and cutting the laminate into a desired size.

(2) Glass Transition Temperature (Tg)

The tan δ peak of an evaluation sample measured in the condition of a heating rate of 5° C./minute with a dynamic mechanical analyzer (product name: DMA983; manufactured by: TA Instruments) was determined as glass transition temperature (Tg).

Evaluation samples were each obtained by removing the copper foils of each laminate having the copper foils on both surfaces thereof by etching, and cutting the laminate into a desired size.

(3) Flame Resistance

Flame resistance was evaluated based on the UL94V test.

Evaluation samples were each obtained by removing the copper foils of each laminate having the copper foils on both surfaces thereof by etching, and cutting the laminate into a desired size.

(4) Heat Resistance

After evaluation samples were left in a POT environment of a temperature of 12 1° C., a humidity of 100%, a pressure of 2 atm, and a time of 2 hours, they were immersed in a solder bath at 288° C. for 30 seconds and observed for the presence of a blister in the copper foil/insulating layer.

Evaluation samples were each obtained by cutting each laminate having the copper foils on both surfaces thereof into a desired size.

(5) Insulation Reliability

A voltage of 20 V was applied to evaluation samples in an environment of a temperature of 130° C., and a humidity of 85%, and their resistive behaviors after 200 hours under humidity were observed.

The multilayer copper-clad laminates processed above were used as evaluation samples.

(6) Reference Experiment 1 (Humidity Resistant Reliability)

Humidity resistant reliability each of the multilayer copper-clad laminates comprising the resin compositions obtained in Examples 1 to 7 was evaluated by a pressure cooker test (PCT). Evaluation samples were each obtained by removing the outer layer copper foils of each multilayer copper-clad laminate by etching, and cutting the laminate into a desired size.

After the evaluation samples were left in a pressure cooker test (PCT) environment of a temperature of 121° C., a humidity of 100%, and a pressure of 2 atm for 96 hours and 400 hours, they were observed for the presence of peeling of the inner layer copper foil/insulating layer.

(7) Reference Experiment 2 (Chemical Resistance)

Chemical resistance each of the multilayer copper-clad laminates comprising the resin compositions obtained in Examples 1 to 7 was evaluated. Evaluation samples were each obtained by removing the outer layer copper foils of each multilayer copper-clad laminate by etching, and cutting the laminate into a desired size.

The evaluation samples were immersed in a swelling agent (product name: Swelling Dip Securiganth P500; manufactured by: Atotech Japan K.K.) at 80° C. for 5 minutes. Next, the evaluation samples were immersed in a potassium permanganate aqueous solution (product name: Concentrate Compact CP; manufactured by: Atotech Japan K.K.) at 80° C. for 10 minutes, followed by an oxidation treatment and neutralization. After the samples were dried, their resin surfaces were observed by means of a SEM.

The surfaces of the etched evaluation samples were in the state that the roughened surface of the copper foils having a thickness of 12 μm (manufactured by: Mitsui Mining & Smelting Co., Ltd.) used in the sample production is transferred. When the oxidation treatment is excessively performed with the potassium permanganate aqueous solution, the resin is removed by oxidation to expose the filler. The resin surface was observed with the SEM for the degree and shape of the transferred roughness and the presence of a resin crack and filler exposure. The state in which the shape of the transferred roughened surface of the copper foils before the oxidation treatment is maintained, was evaluated as having no problem (OK), while the state in which the shape of the transferred roughened surface of the copper foils before the oxidation treatment is not maintained and the filler is exposed, was evaluated as having a problem (NG).

Figure 2:
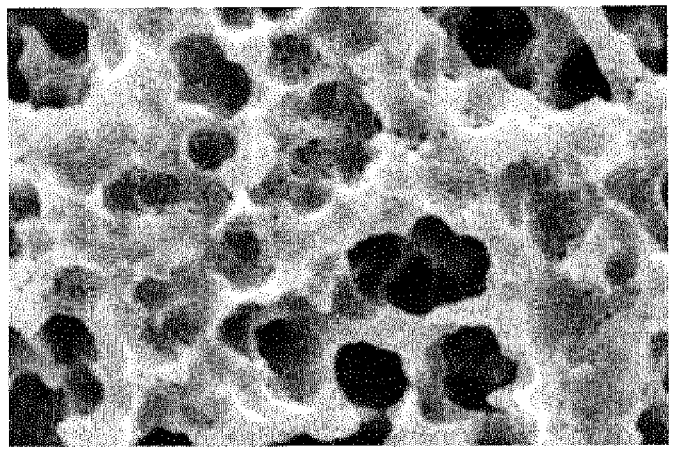
FIG. 2 shows a SEM photograph of an example that was evaluated as having no problem after the chemical resistance test.
Figure 3:
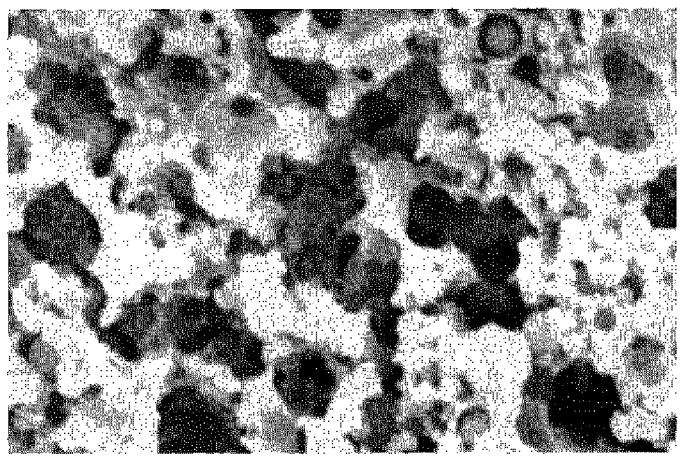
FIG. 3 shows a SEM photograph of an example that was evaluated as having a problem after the chemical resistance test.

For reference, a SEM photograph of the evaluation sample is shown in FIG. 1, which was obtained by removing the outer layer copper foils of the multilayer copper-clad laminate by etching (that is, the sample was not treated with the chemical solutions). FIG. 2 shows a photograph of the case where the evaluation sample was determined as having no problem (OK) after the sample was treated with the chemical solutions. FIG. 3 shows a photograph of the case where the evaluation sample was determined as having a problem (NG) after the sample was treated with the chemical solutions.

The laminates obtained in Examples and Comparative examples were evaluated for the above properties. The obtained results are shown in Tables 1 and 2. The results of Reference experiments 1 and 2 are shown in Table 3.

TABLE 1

| | | Example 1 | Example 2 | Example 3 | Example 4 | Example 5 | Example 6 | Example 7 |
|---|---|---|---|---|---|---|---|---|
| Spherical fused silica | SO-25H | 110 | 110 | 110 | 110 | 110 | 110 | 110 |
| Coupling agent | A187 | 0.5 | 0.5 | 0.5 | 05 | 0.5 | 0.5 | 0.5 |
| (A) Epoxy resin | NC3000 | 50 | 50 | 50 | 50 | 50 | 50 | 50 |
| (B) Cyanate resin | PT-30 | 25 | 25 | 25 | 25 | 25 | | |
| | DT-4000 | | | | | | 25 | |
| | BA200 | | | | | | | 25 |
| (C) Onium salt compound | Compound I | 1.9 | | | | | 1.9 | 1.9 |
| | Compound II | | 1.3 | | | | | |
| | Compound III | | | 1.2 | | | | |
| | Compound IV | | | | 1.4 | | | |
| | Compound V | | | | | 1.4 | | |
| Linear expansion coefficient (ppm/° C.) | | 8.9 | 8.9 | 9.1 | 9.0 | 9.0 | 8.9 | 8.8 |
| Tg (° C.) | | 260 | 255 | 258 | 261 | 265 | 240 | 242 |
| Flame resistance | | V-0 | V-0 | V-0 | V-0 | V-0 | V-0 | V-0 |
| Heat resistance (solder at 288° C.) | | No blister observed | No blister observed | No blister observed | No blister observed | No blister observed | No blister observed | No blister observed |
| Insulation reliability (Resistance value (Ω)) | | 1E+09 | 1E+09 | 1E+09 | 1E+09 | 1E+09 | 1E+09 | 1E+09 |

TABLE 2

| | | Comparative example 1 | Comparative example 2 | Comparative example 3 | Comparative example 4 | Comparative example 5 |
|---|---|---|---|---|---|---|
| Spherical fused silica | SO-25H | 110 | 110 | 110 | 110 | 110 |
| Coupling agent | A187 | 0.5 | 0.5 | 0.5 | 0.5 | 0.5 |
| (A) Epoxy resin | NC3000 | 50 | 50 | 50 | 50 | 50 |
| (B) Cyanate resin | PT-30 | 25 | 25 | 25 | | |
| | DT-4000 | | | | 25 | |
| | BA200 | | | | | 25 |
| Imidazole compound | 1B2PZ | 0.4 | | | 0.5 | 0.5 |
| | 2P4MZ | | 0.3 | | | |
| Amine compound | DBU | | | 0.3 | | |
| Linear expansion coefficient (ppm/° C.) | | 9.2 | 9.0 | 8.9 | 8.9 | 8.9 |

TABLE 2-continued

|  | Comparative example 1 | Comparative example 2 | Comparative example 3 | Comparative example 4 | Comparative example 5 |
|---|---|---|---|---|---|
| Tg (° C.) | 266 | 263 | 260 | 243 | 241 |
| Flame resistance | V-0 | V-0 | V-0 | V-0 | V-0 |
| Heat resistance (solder at 288° C.) | No blister observed | No blister observed | Blister observed | No blister observed | No blister observed |
| Insulation reliability (Ω) | 1E+07 | 1E+07 | Shorted | 1E+07 | 1E+07 |

TABLE 3

|  |  | Example 1 | Example 2 | Example 3 | Example 4 | Example 5 | Example 6 | Example 7 |
|---|---|---|---|---|---|---|---|---|
| Spherical fused silica | SO-25H | 110 | 110 | 110 | 110 | 110 | 110 | 110 |
| Coupling agent | A187 | 0.5 | 0.5 | 0.5 | 0.5 | 0.5 | 0.5 | 0.5 |
| (A) Epoxy resin | NC3000 | 50 | 50 | 50 | 50 | 50 | 50 | 50 |
| (B) Cyanate resin | PT-30 | 25 | 25 | 25 | 25 | 25 |  |  |
|  | DT-4000 |  |  |  |  |  | 25 |  |
|  | BA200 |  |  |  |  |  |  | 25 |
| (C) Onium salt compound | Compound I | 1.9 |  |  |  |  | 1.9 | 1.9 |
|  | Compound II |  | 1.3 |  |  |  |  |  |
|  | Compound III |  |  | 1.2 |  |  |  |  |
|  | Compound IIV |  |  |  | 1.4 |  |  |  |
|  | Compound V |  |  |  |  | 1.4 |  |  |
| Humidity resistant reliability | 96 hrs | No peeling observed | No peeling observed | No peeling observed | No peeling observed | No peeling observed | No peeling observed | No peeling observed |
|  | 400 hrs | No peeling observed | No peeling observed | No peeling observed | No peeling observed | No peeling observed | No peeling observed | No peeling observed |
| Chemical resistance (80° C./10 min) |  | No problem | No problem | No problem | No problem | No problem | No problem | No problem |

As is clear from Table 1, the laminates of Examples each comprising the resin composition of the present invention had a low thermal expansion coefficient, a high Tg, excellent flame resistance and excellent insulation reliability.

On the other hand, as shown in Table 2, Comparative examples 1, 2, 4 and 5 comprising imidazole compounds and Comparative example 3 comprising DBU (diazabicycloundecene), which is an amine compound, resulted in poor insulation reliability.

The results of Reference experiments 1 and 2 shown in Table 3 show that from the viewpoint of obtaining excellent humidity resistant reliability and chemical resistance, it is preferable that the resin composition of the present invention comprises no phenol resin. Conventionally, a resin composition comprising an epoxy resin, cyanate resin and phenol resin has been used for the insulating layer or prepreg of the printed wiring board; however, such a resin composition is likely to exhibit poor humidity resistant reliability and chemical resistance under PCT environment. To the contrary, the resin compositions used in Examples comprises no phenol resin, so that they exhibited excellent humidity resistant reliability and chemical resistance.

INDUSTRIAL APPLICABILITY

According to the present invention, it is possible to produce a laminate and multilayer printed wiring board which have excellent insulation reliability, a high Tg and a low thermal expansion coefficient, and which also have heat resistance and flame resistance. They are useful as a printed wiring board which is capable of high-density mounting with growing demand for highly-functioned electronics.

The invention claimed is:

1. A resin composition comprising:
(A) an epoxy resin,
(B) a cyanate resin and
(C) an onium salt compound as essential components,
wherein the onium salt compound (C) is a compound selected from the group consisting of the following formulae (2), (3) and (4):

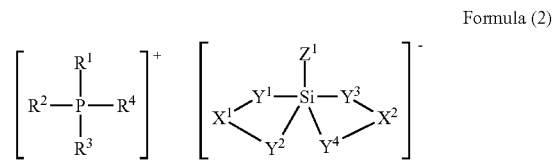

Formula (2)

wherein P is a phosphorus atom;

each of $R^1$, $R^2$, $R^3$ and $R^4$ is an organic group having a substituted or unsubstituted, aromatic or heterocyclic ring or is a substituted or unsubstituted aliphatic group; wherein $R^1$ to $R^4$ are identical or different from each other;

$X^1$ is an organic group bonding to substituents $Y^1$ and $Y^2$;

$X^2$ is an organic group bonding to substituents $Y^3$ and $Y^4$;

wherein $X^1$ and $X^2$ are identical or different from each other;

each of $Y^1$ and $Y^2$ is a group resulting from a proton-donating substituent through release of a proton;

wherein $Y^1$ and $Y^2$ in the same molecule bond to a silicon atom to form a chelate structure;

each of $Y^3$ and $Y^4$ is a group resulting from a proton-donating substituent through release of a proton;

wherein $Y^3$ and $Y^4$ in the same molecule bond to a silicon atom to form a chelate structure;

$Y^1$, $Y^2$, $Y^3$ and $Y^4$ are identical or different from each other; and $Z^1$ is an organic group having a substituted or unsubstituted, aromatic or heterocyclic ring or is a substituted or unsubstituted aliphatic group;

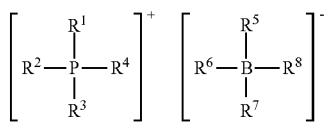

Formula (3)

wherein P is a phosphorus atom;
B is a boron atom;
each of $R^1$, $R^2$, $R^3$ and $R^4$ is an organic group having substituted or unsubstituted, aromatic or heterocyclic ring or is a substituted or unsubstituted aliphatic group; wherein $R^1$ to $R^4$ are identical or different from each other;
each of $R^5$, $R^6$, $R^7$ and $R^8$ is selected from the group consisting of an organic group having a substituted or unsubstituted, aromatic or heterocyclic ring, a substituted or unsubstituted aliphatic group, and an $n(n \geq 1)$-valent proton donor having in a molecule at least one or more protons which can be released from the molecule; and $R^5$ to $R^8$ are identical or different from each other;

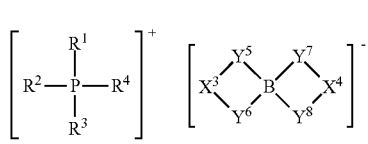

Formula (4)

wherein P is a phosphorus atom;
B is a boron atom;
each of $R^1$, $R^2$, $R^3$ and $R^4$ is an organic group having a substituted or unsubstituted, aromatic or heterocyclic ring or is a substituted or unsubstituted aliphatic group; wherein $R^1$ to $R^4$ are identical or different from each other;
$X^3$ is an organic group bonding to substituents $Y^5$ and $Y^6$;
$X^4$ is an organic group bonding to substituents $Y^7$ and $Y^8$;
wherein $X^3$ and $X^4$ are identical or different from each other;
each of $Y^5$ and $Y^6$ is a group resulting from a proton-donating substituent through release of a proton;
wherein $Y^5$ and $Y^6$ in the same molecule bond to a boron atom to form a chelate structure;
each of $Y^7$ and $Y^8$ is a group resulting from a proton-donating substituent through release of a proton;
wherein $Y^7$ and $Y^8$ in the same molecule bond to a boron atom to form a chelate structure; and
$Y^5$, $Y^6$, $Y^7$ and $Y^8$ are identical or different from each other;
wherein an amount of the cyanate resin (B) is in the range of 0.25 to 9.00 with respect to an amount of the epoxy resin (A) being 1; and
a content of the onium salt, compound (C) is in the range of 0.01 to 10% by weight with respect to a total amount of the epoxy resin (A) and the cyanate resin (B).

2. The resin composition according, to claim 1, wherein the resin composition further comprises an inorganic filler.

3. The resin composition according to claim 1, wherein the epoxy resin (A) has two or more epoxy groups in a molecule, and is one or more kinds selected from the group consisting of bisphenol type epoxy resins, biphenyl type epoxy resins, biphenyl aralkyl type epoxy resins, stilbene type epoxy resins, naphthalene, type epoxy resins, dicyclopentadiene type epoxy resins, dihydroxybenzene type epoxy resins, epoxy resins produced by oxidizing olefin with peracid to epoxidate, and glycidyl ester type epoxy resins.

4. The resin composition according to claim 1, wherein the cyanate resin (B) is one or more kinds selected from the group consisting of novolac type cyanate resins and dicyclopentadiene type cyanate resins.

5. The resin composition according to claim 1, wherein the amount of the cyanate resin (B) is in the range of 0.4 to 6.00 with respect to the amount of the epoxy resin (A) being 1.

6. The resin composition according to claim 1, wherein the content of the onium salt compound (C) is in the range of 0.1 to 5% by weight with respect to the total amount of the epoxy resin (A) and the cyanate resin (B).

7. A prepreg comprising a base material impregnated with the resin composition according to claim 1.

8. A multilayer printed wiring board obtained by laying the prepreg defined by claim 7 on one or both surfaces of an inner layer circuit board, and applying heat and pressure.

9. The multilayer printed wiring board according to claim 8, comprising as the inner layer circuit board a metal-clad laminate comprising a resin-impregnated base material layer and a metal foil, wherein the metal foil is on at least one surface of the resin-impregnated base material layer, and the resin-impregnated base material layer comprises a base material impregnated with the resin composition.

10. A semiconductor device comprising the multiplayer printed wiring board defined by claim 8, and a semiconductor element mounted on the primed wiring board.

11. A resin sheet comprising an insulating layer and a film or metal foil, wherein the insulating layer is on the film or metal foil, and comprises the resin composition according to claim 1.

12. A metal-clad laminate comprising a resin-impregnated base material layer and a metal foil, wherein the metal foil is on at least one surface of the resin-impregnated base material layer, and the resin-impregnated base material layer comprises a base material impregnated with the resin composition according to claim 1.

13. The metal-clad laminate according to claim 12, obtained by laying a metal foil on at least one surface of a prepreg or on at least one surface of a stack of two or more prepregs, the prepreg or each of the prepregs being a prepreg comprising a base material impregnated with the resin composition, and applying heat and pressure.

14. A printed wiring board comprising the metal-clad laminate defined by claim 12 as an inner layer circuit board.

15. A semiconductor device comprising the printed wiring board defined by claim 14, and a semiconductor element mounted on the printed wiring board.

16. A multilayer printed wiring board comprising an insulating layer and an inner layer circuit, wherein the insulating layer is on the inner layer circuit, and comprises the epoxy resin composition defined by claim 1.

17. The multilayer printed wiring board according to claim 16, obtained by laying a resin sheet, on one or both surfaces of an inner layer circuit board, and applying heat and pressure, wherein said resin sheet comprises an insulating layer and a film or metal foil, wherein the insulating layer is on the film or metal foil, and comprises the resin composition.

18. The multilayer printed wiring board according to claim 17, comprising as the inner layer circuit board a metal-clad laminate comprising a resin-impregnated base material layer and a metal foil, wherein the metal foil is on at least one surface of the resin-impregnated base material layer, and the resin-impregnated base material layer comprises a base material impregnated with the resin composition.

19. A semiconductor device comprising the multiplayer printed wiring board defined by claim 16, and a semiconductor element mounted on the printed wiring board.

* * * * *